United States Patent
Sato et al.

(10) Patent No.: US 11,410,868 B2
(45) Date of Patent: Aug. 9, 2022

(54) ELECTROSTATIC CHUCK

(71) Applicant: TOTO LTD., Kitakyushu (JP)

(72) Inventors: Masaki Sato, Kitakyushu (JP); Ikuo Itakura, Kitakyushu (JP); Shuichiro Saigan, Kitakyushu (JP); Jun Shiraishi, Kitakyushu (JP); Yutaka Momiyama, Kitakyushu (JP); Kouta Kobayashi, Kitakyushu (JP)

(73) Assignee: Toto Ltd., Fukuoka (JP)

( * ) Notice: Subject to any disclaimer, the term of this patent is extended or adjusted under 35 U.S.C. 154(b) by 0 days.

(21) Appl. No.: 17/179,994

(22) Filed: Feb. 19, 2021

(65) Prior Publication Data

US 2021/0175109 A1 Jun. 10, 2021

Related U.S. Application Data

(63) Continuation of application No. PCT/JP2020/031821, filed on Aug. 24, 2020.

(30) Foreign Application Priority Data

Sep. 6, 2019 (JP) .............................. JP2019-162537
Sep. 6, 2019 (JP) .............................. JP2019-162538

(51) Int. Cl.
*H01L 21/683* (2006.01)

(52) U.S. Cl.
CPC ................................ *H01L 21/6833* (2013.01)

(58) Field of Classification Search
CPC .................................................. H01L 21/6833
See application file for complete search history.

(56) References Cited

U.S. PATENT DOCUMENTS

| | | | |
|---|---|---|---|
| 6,475,336 B1 | 11/2002 | Hubacek | |
| 9,275,836 B2 * | 3/2016 | Himori | ............ H01J 37/32715 |
| 10,410,902 B2 * | 9/2019 | Sasaki | ................ H01L 21/6833 |
| 2003/0106647 A1 | 6/2003 | Koshiishi | |
| 2012/0160808 A1 | 6/2012 | Kikuchi et al. | |

(Continued)

FOREIGN PATENT DOCUMENTS

| | | |
|---|---|---|
| JP | 2002-033376 A | 1/2002 |
| JP | 2004-511901 A | 4/2004 |

(Continued)

*Primary Examiner* — Scott Bauer
(74) *Attorney, Agent, or Firm* — Carrier Blackman & Associates, P.C.; Joseph P. Carrier; William D. Blackman

(57) ABSTRACT

An electrostatic chuck includes: an electrically-conductive base plate including a first part, a second part at an outer circumference of the first part, and a gas inlet path for introducing a cooling gas; a first electrostatic chuck part configured to clamp a wafer on the first part, including a ceramic dielectric substrate that includes an embedded first clamping electrode and at least one through-hole communicating with the gas inlet path; and a second electrostatic chuck part configured to clamp a focus ring on the second part, including a ceramic layer that includes at least one through-hole for introducing a cooling gas and that includes at least a first layer contacting the focus ring when the second electrostatic chuck part clamps the focus ring, in which the first layer is less dense than the ceramic dielectric substrate. Thereby, the electrostatic chuck can increase the device yield.

10 Claims, 9 Drawing Sheets

(56) References Cited

U.S. PATENT DOCUMENTS

| | | | |
|---|---|---|---|
| 2017/0352568 A1 | 12/2017 | Cho et al. | |
| 2018/0019107 A1* | 1/2018 | Ishizawa | H01J 37/32899 |
| 2018/0294177 A1 | 10/2018 | Peng et al. | |
| 2019/0318918 A1* | 10/2019 | Saitoh | H01J 37/3299 |
| 2020/0126837 A1 | 4/2020 | Kuno et al. | |
| 2020/0176228 A1* | 6/2020 | Oka | H01L 21/6831 |
| 2020/0251371 A1* | 8/2020 | Kuno | H01L 21/67103 |
| 2020/0286769 A1* | 9/2020 | Shiraishi | H01L 21/67253 |

FOREIGN PATENT DOCUMENTS

| | | | |
|---|---|---|---|
| JP | 2004-296553 A | 10/2004 | |
| JP | 2012-134375 A | 7/2012 | |
| KR | 2018-0087411 A | 8/2018 | |
| WO | 02/31219 A1 | 4/2002 | |
| WO | 2019/087977 A1 | 5/2019 | |
| WO | 2019/163757 A1 | 8/2019 | |

\* cited by examiner

ELECTROSTATIC CHUCK

CROSS-REFERENCE TO RELATED APPLICATIONS

This is a continuation application of International Application PCT/JP2020/031821, filed on Aug. 24, 2020. This application also claims priority to Japanese Application No. 2019-162537, filed on Sep. 6, 2019, and Japanese Application No. 2019-162538, filed on Sep. 6, 2019; the entire contents of which are incorporated herein by reference.

FIELD OF THE INVENTION

Embodiments described herein relate generally to an electrostatic chuck.

BACKGROUND OF THE INVENTION

A processing body mounting device that includes an electrostatic chuck is used as means for clamping a processing object such as a semiconductor wafer, a glass substrate, etc., inside a plasma processing chamber that performs etching, CVD (Chemical Vapor Deposition), sputtering, ion implantation, ashing, etc. The electrostatic chuck applies electrical power for electrostatic clamping to an embedded electrode and clamps a substrate such as a silicon wafer, etc., by an electrostatic force.

FIG. 2 of JP-A 2002-033376 shows a processing body mounting device including a wafer chuck on which a semiconductor wafer is placed, an electrostatic chuck that is located at a wafer chuck upper surface, and a focus ring that is located at an outer circumference edge portion of the wafer chuck and surrounds the electrostatic chuck. FIG. 1 of JP-A 2002-033376 shows a processing body mounting device that reduces the temporal change of plasma processing characteristics at the focus ring vicinity and processes the entire surface of the processing body more uniformly by increasing the cooling performance of the focus ring and improving the etching characteristics of the outer circumference edge portion of the semiconductor wafer.

Generally, current trends include not only the increasing demand of semiconductor manufacturing apparatuses applicable to deep patterning and fine patterning technology for realizing 3D NAND and FinFET structures and the like as well as advances in plasma processing for higher device integration, but also the increasing level of requirements for electrostatic chucks. Specifically, dense ceramic sintered bodies are widely used as ceramic materials selected for the surface that clamps the wafer in order to suppress the generation of particles due to contact and sliding of the wafer and to ensure resistance to plasma. On the other hand, high chip yields in semiconductor manufacturing also are necessary as technology progresses and processes become more complex.

In the processes of making chips from a silicon wafer, the wafer edge vicinity is an important region for improving the chip yield per wafer because the number of chips increases at the wafer edge vicinity due to geometry. On the other hand, the etching rate at the wafer edge portion becomes nonuniform due to structural singularities at the wafer edge portion; therefore, the chip yield undesirably decreases.

It is desirable to further increase the yield at the semiconductor wafer outer circumference portion due to even higher device integration and advances in plasma processing.

SUMMARY OF THE INVENTION

According to one embodiment, an electrostatic chuck includes: an electrically-conductive base plate including a first part, a second part at an outer circumference of the first part, and a gas inlet path for introducing a cooling gas; a first electrostatic chuck part configured to clamp a wafer on the first part, including a ceramic dielectric substrate that includes an embedded first clamping electrode and at least one through-hole communicating with the gas inlet path; and a second electrostatic chuck part configured to clamp a focus ring on the second part, including a ceramic layer that includes at least one through-hole for introducing a cooling gas and that includes at least a first layer contacting the focus ring when the second electrostatic chuck part clamps the focus ring, in which the first layer is less dense than the ceramic dielectric substrate.

A first invention is an electrostatic chuck that includes: an electrically-conductive base plate including a first part, a second part at an outer circumference of the first part, and a gas inlet path for introducing a cooling gas; a first electrostatic chuck part configured to clamp a wafer on the first part, including a ceramic dielectric substrate that includes an embedded first clamping electrode and at least one through-hole communicating with the gas inlet path; and a second electrostatic chuck part configured to clamp a focus ring on the second part, including a ceramic layer that includes at least one through-hole for introducing a cooling gas and that includes at least a first layer contacting the focus ring when the second electrostatic chuck part clamps the focus ring, in which the first layer is less dense than the ceramic dielectric substrate.

As plasma processing technology advances, a dense ceramic that has low particle generation and excellent plasma resistance is desirable. On the other hand, the inventors newly discovered that the heat amount that is input to the plasma processing apparatus increases as plasma processing technology advances; a particularly large amount of heat collects in the focus ring portion positioned at the wafer outer circumference; and the yield of the device decreases. Also, the decrease of the yield of the device at the outer circumference side of the wafer is problematic because the temperature of the outer circumference portion undesirably increases due to more heat easily collecting at the outer circumference because the focus ring is thick.

According to the electrostatic chuck, the first electrostatic chuck part that clamps the wafer includes a ceramic dielectric substrate; the second electrostatic chuck part that clamps the focus ring includes a ceramic layer; and the density of the ceramic layer is less than that of the ceramic dielectric substrate. The density of the ceramic layer of the second electrostatic chuck part, i.e., the outer circumference portion, is relatively low; therefore, the gas amount that is supplied to the focus ring can be increased, and the gas can uniformly reach the outer circumference portion. Also, the second electrostatic chuck part includes the ceramic layer having a reduced density (porous) while ensuring the low particle generation and plasma resistance of the wafer clamping part by the first electrostatic chuck part including a ceramic dielectric substrate; therefore, the problem of the heat at the outer circumference portion can be effectively solved; both low particle generation and thermal uniformity can be realized; and the yield of the device can be increased.

A second invention is the electrostatic chuck of the first invention, wherein the ceramic layer further includes a second layer provided between the second part and the first layer.

According to the electrostatic chuck, the second layer is located between the electrically-conductive base plate and the first layer; therefore, for example, the thermal effects on the first layer of the ceramic layer due to the temperature change of the base plate are relaxed; and if the second layer is a high resistance layer, the first layer of the ceramic layer is electrically independent of the base plate to which the high frequency (RF) for plasma generation is applied, and a stable clamping force of the second electrostatic chuck part is possible. For example, dielectric breakdown of the ceramic layer also can be suppressed when high frequency power is applied using the base plate as a lower electrode.

A third invention is the electrostatic chuck of the second invention, wherein a density of the second layer is greater than a density of the first layer.

According to the electrostatic chuck, the density of the first layer positioned at the focus ring side is relatively small; therefore, a gas can be efficiently supplied to the upper surface side of the ceramic layer; and the cooling performance of the focus ring can be further increased. Also, for example, the insulative properties of the base plate side to which the high frequency power is applied can be even further increased, and dielectric breakdown of the second electrostatic chuck part can be suppressed.

A fourth invention is the electrostatic chuck of the second invention, wherein a density of the first layer is greater than a density of the second layer.

According to the electrostatic chuck, the cooling power can be guaranteed by actively causing a cooling gas to flow in the second layer while ensuring the plasma resistance of the first layer by the configuration described above. Thermal uniformity can be further ensured by using the first layer as a quasi thermal relaxation layer.

A fifth invention is the electrostatic chuck of any one of the second to fourth inventions, wherein: the first layer includes a first upper surface at the focus ring side, and a first lower surface at a side opposite to the first upper surface; the second layer includes a second upper surface at the first layer side, and a second lower surface at a side opposite to the second upper surface; and a surface roughness of the first upper surface is less than a surface roughness of the second lower surface.

According to the electrostatic chuck, by setting the surface roughness of the second lower surface to be relatively large, the contact area with the base plate can be increased by the second layer jutting into the base plate; and the cooling efficiency can be increased. Also, because the surface roughness of the first upper surface is relatively small, the contact area with the focus ring front surface that has a smaller surface roughness than the base plate front surface can be increased; the focus ring can be efficiently cooled; and the focus ring can be more securely clamped.

A sixth invention is the electrostatic chuck of any one of the second to fifth inventions, wherein: the first layer includes a first upper surface at the focus ring side, and a first lower surface at a side opposite to the first upper surface; the first layer and the second layer are provided in contact, a boundary is located between the first layer and the second layer, and the surface roughness of the first upper surface is less than the surface roughness of the boundary.

According to the electrostatic chuck, by setting the surface roughness of the boundary to be relatively large, the contact area at the boundary can be increased, and the cooling efficiency can be increased. Also, because the surface roughness of the first upper surface is relatively small, the contact area with the focus ring front surface can be increased, the focus ring can be efficiently cooled, and the focus ring can be more securely clamped.

A seventh invention is the electrostatic chuck of any one of the second to sixth inventions, wherein: the second electrostatic chuck part further includes a second clamping electrode embedded in the ceramic layer; the first layer includes a first upper surface at the focus ring side, and a first lower surface at a side opposite to the first upper surface; the second layer includes a second upper surface at the first layer side, and a second lower surface at a side opposite to the second upper surface; the second clamping electrode is located between the first lower surface and the second upper surface; the second clamping electrode includes a second electrode upper surface at the first lower surface side, and a second electrode lower surface at a side opposite to the second electrode upper surface; and a surface roughness of the second electrode upper surface is less than a surface roughness of the second electrode lower surface.

According to the electrostatic chuck, because the surface roughness of the second electrode upper surface is set to be relatively small, the thickness fluctuation of the first layer positioned on the second clamping electrode can be small; the focus ring can be more stably clamped; as a result, the focus ring can be cooled stably and efficiently. On the other hand, because the second clamping electrode is embedded in the ceramic layer (between the first layer and the second layer), for example, there is a risk that discrepancies such as delamination due to the thermal expansion coefficient difference of the materials, etc., may occur. Because the surface roughness of the second electrode lower surface is set to be relatively large, both the adhesion with the ceramic layer and the cooling efficiency can be realized.

An eighth invention is the electrostatic chuck of any one of the first to seventh inventions, wherein: the first layer includes a first upper surface at the focus ring side, a first lower surface at a side opposite to the first upper surface, a first inner side surface that is at the first electrostatic chuck part side and is perpendicular to the first upper surface and the first lower surface, and a first outer side surface that is at a side opposite to the first inner side surface; and the first outer side surface is covered with the second layer.

According to the electrostatic chuck, low particle generation and plasma resistance can be realized with good cooling performance and thermal uniformity.

A ninth invention is the electrostatic chuck of the eighth invention, wherein an edge region includes an edge portion of the ceramic layer and includes the first and second layers, and a proportion of the first layer increases toward the first upper surface side.

According to the electrostatic chuck, low particle generation and plasma resistance can be realized with good cooling performance and thermal uniformity.

A tenth invention is the electrostatic chuck of any one of the first to ninth inventions, wherein: the first layer includes a first upper surface at the focus ring side, and a first lower surface at a side opposite to the first upper surface; and an edge portion of the first upper surface is beveled.

According to the electrostatic chuck, particle generation from the outer circumference edge portion at which the thermal load is large can be effectively suppressed.

DETAILED DESCRIPTION

Figure 1:
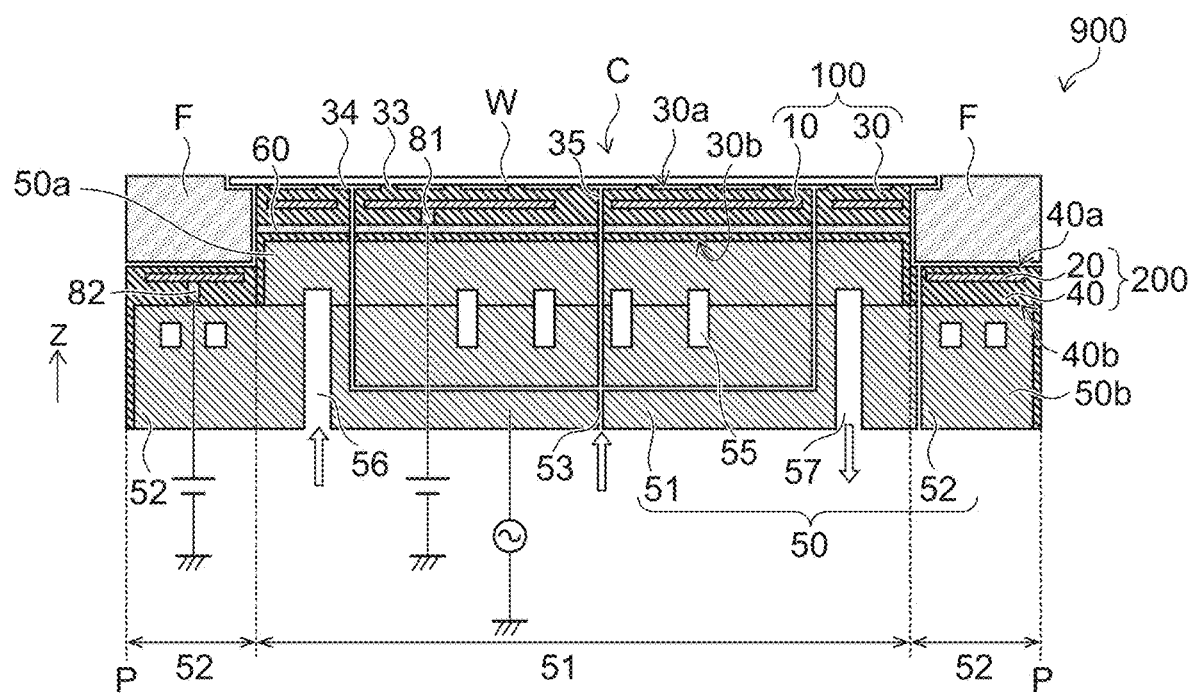
FIG. 1 is a cross-sectional view schematically illustrating an electrostatic chuck according to an embodiment.

Exemplary embodiments will now be described with reference to the drawings. Similar components in the drawings are marked with like reference numerals, and a detailed description is omitted as appropriate.

FIG. 1 is a schematic cross-sectional view illustrating an electrostatic chuck according to an embodiment.

As illustrated in FIG. 1, the electrostatic chuck 900 includes an electrically-conductive base plate 50, a first electrostatic chuck part 100 that is configured to clamp a wafer W, and a second electrostatic chuck part 200 that is configured to clamp a focus ring F.

The base plate 50 includes a first part 51 and a second part 52. The second part 52 is located at the outer circumference of the first part 51 in the X-Y plane (described below). The second part 52 is ring-shaped. A gas inlet path 53 into which a cooling gas such as helium or the like is introduced is provided in the base plate 50. In the base plate 50, the first electrostatic chuck part 100 is located on the first part 51; and the second electrostatic chuck part 200 is located on the second part 52.

In this specification, the direction from the base plate 50 (the first part 51) toward the first electrostatic chuck part 100 is taken as a Z-axis direction. One direction orthogonal to the Z-axis direction is taken as an X-axis direction; and a direction orthogonal to the Z-axis direction and the X-axis direction is taken as a Y-axis direction. In this specification, "in the plane" is, for example, in the X-Y plane.

The base plate 50 will now be described in detail.

As shown in FIG. 1, the height (the position in the Z-axis direction) of the upper surface of the first part 51 is greater than the height of the upper surface of the second part 52. The base plate 50 has a staircase configuration in which the second part 52 is lower than the first part 51. The second part 52 is included in a portion of an outer circumference P of the electrostatic chuck 900. The first part 51 includes a center C of the electrostatic chuck 900.

The first electrostatic chuck part 100 includes a ceramic dielectric substrate 30 and a first clamping electrode 10. The ceramic dielectric substrate 30 has at least one through-hole 35 communicating with the gas inlet path 53. The first clamping electrode 10 is embedded in the ceramic dielectric substrate 30.

The ceramic dielectric substrate 30 includes a first major surface 30a at the wafer W side, and a second major surface 30b at the side opposite to the first major surface 30a. The through-hole 35 communicates with multiple grooves 34 provided in the first major surface 30a and distributes a cooling gas introduced from the gas inlet path 53 to the entire first major surface 30a via the grooves 34. Multiple protrusions 33 are provided in the first major surface 30a. The wafer W is clamped by the first electrostatic chuck part 100 via the protrusions 33 when a voltage is applied to the first clamping electrode 10.

The second electrostatic chuck part 200 includes a ceramic layer 40 and a second clamping electrode 20. The ceramic layer 40 includes at least one through-hole 45 communicating with the gas inlet path 53. The second clamping electrode 20 is embedded in the ceramic layer 40.

The ceramic layer 40 includes at least a first layer 41 that contacts the focus ring F when the second electrostatic chuck part 200 clamps the focus ring F. The first layer 41 includes a first upper surface 41u at the focus ring F side, and a first lower surface 41b at the side opposite to the first upper surface 41u. The second clamping electrode 20 includes a second electrode upper surface 20u at the first upper surface 41u side, and a second electrode lower surface 20b at the side opposite to the second electrode upper surface 20u. The focus ring F is clamped to the second electrostatic chuck part 200 by the first upper surface 41u when a voltage is applied to the second clamping electrode 20.

In the electrostatic chuck 900, the density of the first layer 41 of the ceramic layer 40 is less than the density of the ceramic dielectric substrate 30. In other words, the first layer 41 is configured to be rougher than the ceramic dielectric substrate 30. As plasma processing technology advances, a dense ceramic that has low particle generation and excellent plasma resistance is desirable. On the other hand, the inventors newly discovered problems as plasma processing technology advances, in which the yield of the device decreases because the heat amount that is input to the plasma processing apparatus increases, and a particularly large amount of heat collects at the focus ring portion positioned at the wafer outer circumference. Also, the decrease of the yield of the device at the outer circumference side of the wafer is problematic because the temperature of the outer circumference portion undesirably increases due to more heat easily collecting at the outer circumference because the focus ring is thick.

Therefore, in the electrostatic chuck 900, the density of the ceramic layer 40 of the second electrostatic chuck part 200 that is the outer circumference portion is set to be relatively low; therefore, the gas amount that is supplied to the focus ring F can be increased, and the gas can uniformly reach the outer circumference portion. That is, the second electrostatic chuck part 200 includes the ceramic layer 40 and the density of the ceramic layer 40 is reduced, e.g., a porous layer is used, while ensuring low particle generation and plasma resistance at the wafer clamping part by the first electrostatic chuck part 100 including the ceramic dielectric substrate 30; thereby, the problem of the heat at the outer circumference portion can be effectively solved; both low particle generation and thermal uniformity can be realized; and the yield of the device can be increased.

To improve the chip yield per wafer, it is necessary to control the etching rate at the edge vicinity and improve the number of good chips at the edge vicinity. To improve the chip yield at the edge vicinity, a method and a structure are necessary to make the etching state uniform from the wafer center to the edge portion, i.e., the etching state in the radial direction.

Conventionally, as a method and a structure to make the etching state uniform at the wafer edge vicinity, technology is employed in which the bias of the etching is suppressed by disposing a ring-shaped member called a focus ring at the outer circumference of the wafer and by making uniform the plasma environment of the wafer central portion and outer circumference portion in the etching process. One technique of suppressing the bias of the etching includes making the etching state uniform at the wafer edge vicinity by embedding a temperature control technique in the region of the edge ring portion.

In the electrostatic chuck 900, a simple method and structure can realize both thermal uniformity of the focus ring F portion and the particle resistance of the wafer W portion directly exposed to the high density plasma.

In the electrostatic chuck 900, by providing the second electrostatic chuck part 200 and by securely and closely adhering the focus ring F to the electrostatic clamping surface (the first upper surface 41u) by a high electrostatic clamping force, high thermal conductivity is ensured, and the outer circumference portion at which the heat collects particularly easily is effectively cooled. Also, by reducing the density of the electrostatic clamping surface (the first upper surface 41u), e.g., by using a porous layer, a high heat exchange efficiency can be realized by causing a low pressure-loss high flow-rate cooling gas (He gas, etc.) to flow with a simpler method and structure.

Grooves and/or protrusions (dots) (not illustrated) may be provided in the ceramic layer 40 front surface (the first upper surface 41u).

A method for evaluating the densities of the ceramic layer 40 and the ceramic dielectric substrate 30 will now be described.

Cross-sectional images of the ceramic layer 40 and the ceramic dielectric substrate 30 are acquired. A scanning electron microscope SEM (Scanning Electron Microscope) is used to acquire the images. Using the ceramic layer 40 as an example, the second electrostatic chuck part 200 is cut to include the cross section of the ceramic layer 40; and the cross section of the sample is embedded in a resin and mechanically polished. Specifically, a test piece that extends in the Z-axis direction to include the ceramic layer 40 is sampled. The sampling method is, for example, helical machining, waterjet cutting, etc. The observation cross section may be prepared by ion milling. The cross section of the test piece is polished to have a mirror surface; Pt vapor deposition of the sample is performed; and SEM observation is performed. The observation magnification is set to about 200 to 3000 times (as an example, 500 times, etc.) so that the cross-sectional structure can be appropriately observed; and the acceleration voltage is about 5 kV to 15 kV. The observation of five fields is performed to ascertain the fluctuation. When it is difficult to determine the magnitude of the densities of the first layer 41 and the ceramic dielectric substrate 30 by the naked eye, the size relationship can be compared by analyzing the observation images using the commercial two-dimensional image analysis software "WinRoof" and by calculating the porosity. The density increases as the porosity decreases. When calculating the porosity, the average value of five fields is used as the porosity. The density can be similarly evaluated for the ceramic dielectric substrate 30 as well.

Figure 4A:
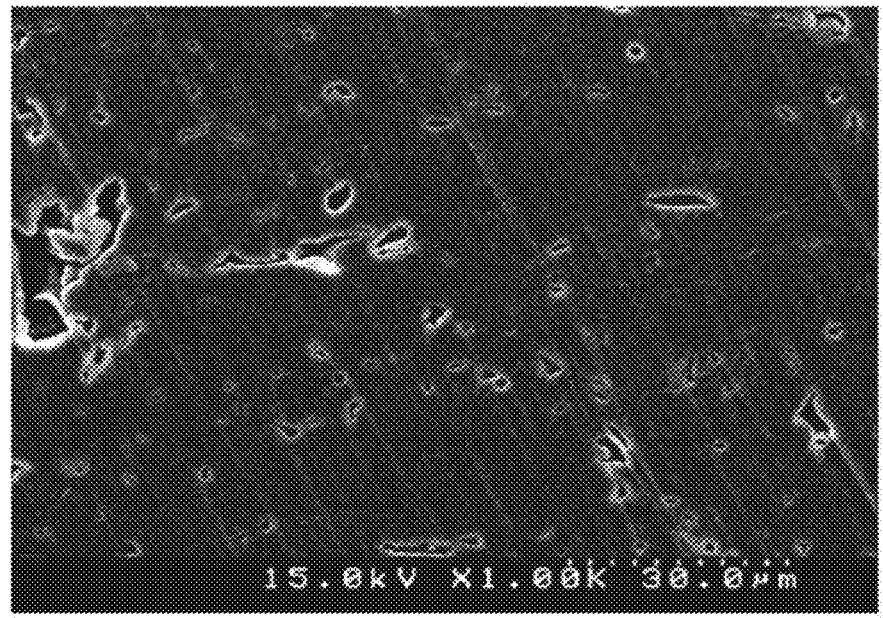
FIGS. 4A and 4B are cross section SEM images of a ceramic layer 40 and a ceramic dielectric substrate 30.
Figure 4B:
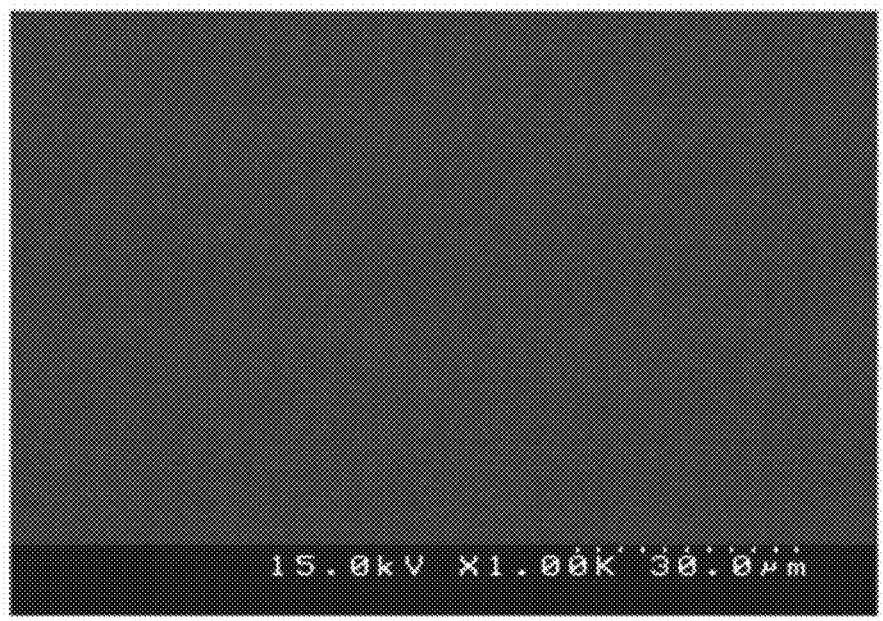

FIGS. 4A and 4B are cross section SEM images of the ceramic layer 40 and the ceramic dielectric substrate 30. FIG. 4A corresponds to the ceramic layer 40 (the first layer 41), and FIG. 4B corresponds to the ceramic dielectric substrate 30.

In the example as shown in FIGS. 4A and 4B, it can be seen with the naked eye that the density of the first layer 41 is less than the density of the ceramic dielectric substrate 30.

Figure 2:
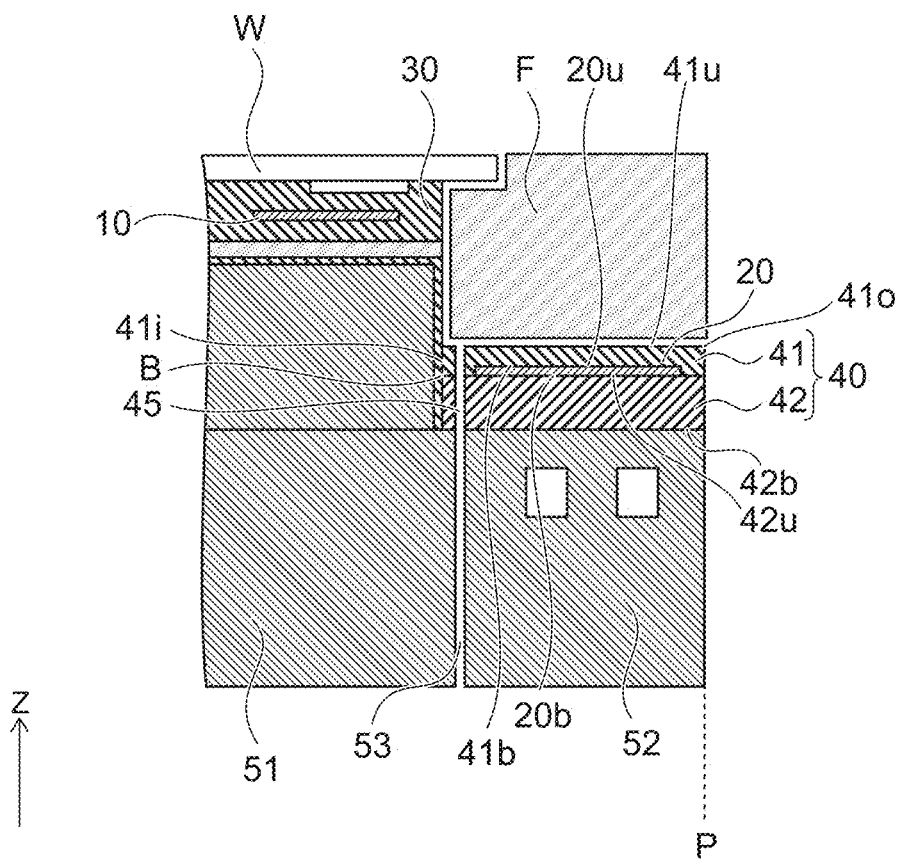
FIG. 2 is an enlarged cross-sectional view schematically illustrating a portion of the electrostatic chuck according to the embodiment.

FIG. 2 is an enlarged cross-sectional view schematically illustrating a portion of the electrostatic chuck according to the embodiment.

FIG. 2 is an enlarged view of the second electrostatic chuck part 200.

In the example shown in FIG. 2, the ceramic layer 40 further includes a second layer 42 provided between the first layer 41 and the second part 52 of the base plate 50. The second layer 42 includes a second upper surface 42u at the first layer 41 side, and a second lower surface 42b at the side opposite to the second upper surface 42u. In the example, the second clamping electrode 20 is provided between the first layer 41 and the second layer 42. More specifically, the second clamping electrode 20 is provided between the first lower surface 41b and the second upper surface 42u. The second clamping electrode 20 may be embedded in the first layer 41, that is, the second clamping electrode 20 may be located between the first upper surface 41u and the first lower surface 41b.

In the example, at least a portion of the first layer 41 is provided in contact with the second layer 42; and a boundary B is located between the first layer 41 and the second layer 42. Specifically, at least a portion of the second upper surface 42u is provided in contact with the first lower surface 41b. Another layer may be included between the first layer 41 and the second layer 42.

In the electrostatic chuck 900, the second layer 42 is located between the electrically-conductive base plate 50 and the first layer 41; therefore, for example, the thermal effects on the first layer 41 of the ceramic layer 40 due to the temperature change of the base plate 50 are relaxed; and if the second layer 42 is a high resistance layer, the first layer 41 of the ceramic layer 40 is electrically independent of the base plate 50 to which the high frequency (RF) for plasma generation is applied; and a stable clamping force of the second electrostatic chuck part 200 is possible. Also, for example, when high frequency power is applied by using the base plate 50 as a lower electrode, the dielectric breakdown of the ceramic layer 40 also can be suppressed.

For example, the base plate 50 is made of a metal such as aluminum, an aluminum alloy, etc.

The ceramic dielectric substrate 30 is, for example, a flat-plate shaped base material made of a sintered ceramic. For example, the ceramic dielectric substrate 30 includes aluminum oxide (alumina ($Al_2O_3$)). Aluminum oxide, yttrium oxide, aluminum nitride, boron nitride, etc., that are highly-insulating materials can be used as the ceramic dielectric substrate. For example, the ceramic dielectric substrate 30 is formed of high-purity aluminum oxide. The concentration of aluminum oxide in the ceramic dielectric substrate 30 is, for example, not less than 90 mass percent (mass %) and not more than 100 mass %, favorably not less than 95 mass percent (mass %) and not more than 100 mass %, and more favorably not less than 99 mass percent (mass %) and not more than 100 mass %. By using high-purity aluminum oxide, the plasma resistance of the ceramic dielectric substrate 30 can be improved. The concentration of the aluminum oxide can be measured by fluorescent X-ray analysis, etc.

In the ceramic layer 40, the first layer 41 is, for example, a ceramic dielectric layer. Specifically, a compound in which another metal oxide is added to a ceramic such as aluminum oxide, aluminum nitride, etc., can be used. For example, it is also favorable to use a compound in which titanium oxide is added to aluminum oxide. As an example, the first layer 41 is a ceramic spray coat.

In the ceramic layer 40, the second layer 42 is, for example, a ceramic insulating layer. The second layer 42 includes, for example, at least one of aluminum oxide, yttrium oxide, aluminum nitride, or boron nitride. Favorably, the second layer 42 is made of aluminum oxide. As an example, the second layer 42 is a ceramic spray coat. The second layer 42 may be an alumite layer formed by anodic oxidation of the base plate 50 that includes aluminum.

In the electrostatic chuck 900, for example, the density of the second layer 42 of the ceramic layer 40 is greater than a density of the first layer 41. In other words, in the ceramic layer 40, as an example, the second layer 42 that is positioned at the base plate 50 side is more dense than the first layer 41. Because the density of the first layer 41 positioned at the focus ring F side is relatively small, the gas can be efficiently supplied to the upper surface side of the ceramic layer 40; and the cooling performance of the focus ring F can be further increased. Also, for example, the insulative properties at the base plate 50 side to which the high frequency power is applied can be even further increased, and the dielectric breakdown of the second electrostatic chuck part 200 can be suppressed.

In the electrostatic chuck 900, for example, the density of the first layer 41 of the ceramic layer 40 is greater than the density of the second layer 42. In other words, in the ceramic layer 40, as an example, the first layer 41 that is positioned at the focus ring F side is more dense than the second layer 42. Therefore, the cooling power can be guaranteed by actively causing the cooling gas to flow in the second layer 42 while ensuring the plasma resistance of the first layer 41. Also, thermal uniformity can be further ensured by using the first layer 41 as a quasi thermal relaxation layer.

Relationships of the thicknesses of the ceramic layer 40 (the first layer 41 and the second layer 42) and the ceramic dielectric substrate 30 of the electrostatic chuck 900 will now be described. Here, the "thickness" is the length along the Z-axis direction of the components such as the first layer 41, etc.

For example, the thickness of the first layer 41 is less than the thickness of the ceramic dielectric substrate 30. In other words, the first layer 41 is thinner than the ceramic dielectric substrate 30. Therefore, the focus ring F can be effectively cooled because the ceramic layer 40 (the first layer 41) of the second electrostatic chuck part 200 positioned at the outer circumference side (the second part 52) at which the heat amount collects more easily is relatively thin.

The relationship of the surface roughnesses of the ceramic layer 40 (the first layer 41 and the second layer 42) and the second clamping electrode 20 of the electrostatic chuck 900 will now be described.

Here, the "surface roughness" means, for example, the arithmetic average roughness (Ra) and can be calculated by the method described below. Here, the first upper surface 41u and the second lower surface 42b of the ceramic layer 40 are described as examples. A test piece is cut out to include the first upper surface 41u and the second lower surface 42b, embedded in a resin, polished, and subsequently observed using a SEM (Scanning Electron Microscope). The arithmetic average roughness Ra is calculated by a method conforming to JIS B 0601:2013 from a SEM image of 100 to 1000 times magnification. A surface roughness Ra-2b of the second lower surface 42b is calculated using a contour curve tracing the interface between the second lower surface 42b and the second part 52 of the base plate 50.

In the electrostatic chuck 900, for example, a surface roughness Ra-1u of the first upper surface 41u is less than the surface roughness Ra-2b of the second lower surface 42b. By setting the surface roughness of the second lower surface 42b to be relatively large, the contact area with the base plate 50 can be increased by the second layer 42 jutting into the base plate 50; and the cooling efficiency can be increased. Also, the surface roughness of the first upper surface 41u is set to be relatively small; therefore, the contact area with the focus ring F surface that has a smaller surface roughness than the base plate 50 surface can be increased; the focus ring F can be efficiently cooled; and the focus ring F can be more securely clamped.

In the electrostatic chuck 900, for example, the surface roughness Ra-1u of the first upper surface 41u is less than a surface roughness Ra-B of the boundary B between the first layer 41 and the second layer 42. By setting the surface roughness of the boundary B to be relatively large, the contact area at the boundary B can be increased, and the cooling efficiency can be increased. Also, the surface roughness of the first upper surface 41u is set to be relatively small; therefore, the contact area with the focus ring F front surface can be increased; the focus ring F can be efficiently cooled; and the focus ring F can be more securely clamped.

In the electrostatic chuck 900, for example, the surface roughness of the second electrode upper surface 20u is less than the surface roughness of the second electrode lower surface 20b. Because the surface roughness of the second electrode upper surface 20u is set to be relatively small, the thickness fluctuation of the first layer 41 positioned on the second clamping electrode 20 can be small, and the contact area with the focus ring F front surface can be increased. The focus ring F can be more stably clamped thereby; as a result, the focus ring F can be stably and efficiently cooled. On the other hand, because the second clamping electrode 20 is embedded in the ceramic layer 40 (between the first layer 41 and the second layer 42), for example, there is a risk that discrepancies such as delamination due to the thermal expansion coefficient difference of the materials, etc., may occur. Because the surface roughness of the second electrode lower surface 20b is set to be relatively large, both the adhesion with the ceramic layer 40 and the cooling efficiency can be realized.

Figure 3A:
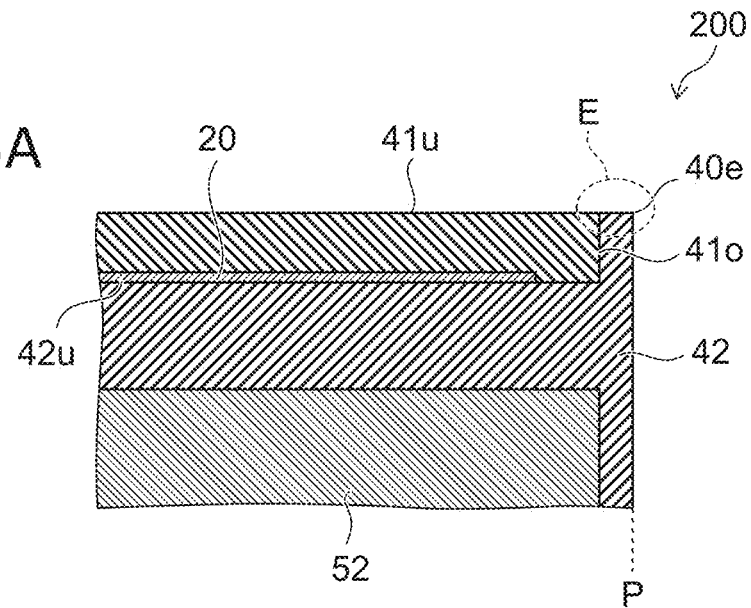
FIGS. 3A and 3B are enlarged cross-sectional views schematically illustrating portions of the electrostatic chuck according to the embodiment.
Figure 3B:
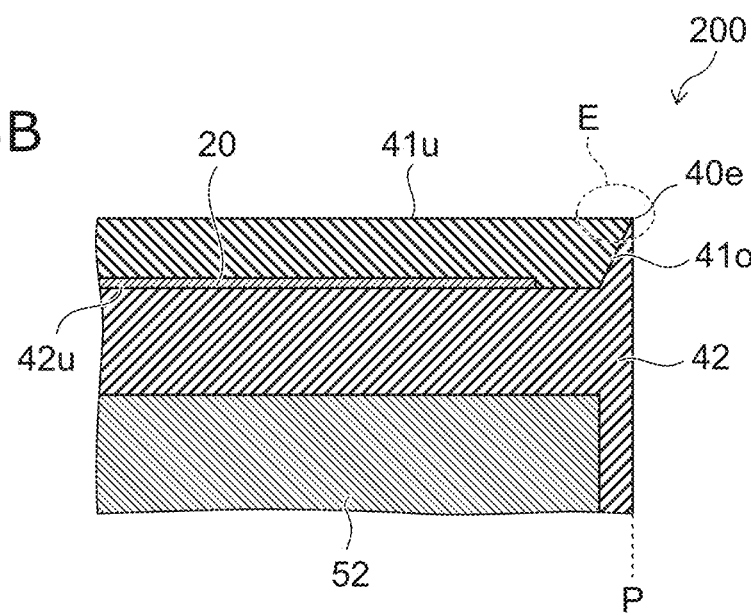

FIGS. 3A and 3B are enlarged cross-sectional views schematically illustrating portions of the electrostatic chuck according to the embodiment.

Modifications of an edge region E that includes an edge portion 40e of the ceramic layer 40 will now be described using FIGS. 3A and 3B.

In the electrostatic chuck 900 as shown in FIG. 3A, for example, the first layer 41 includes a first inner side surface 41i that is perpendicular to the first upper surface 41u and the first lower surface 41b and is at the first electrostatic chuck part 100 side (referring to FIG. 2), and a first outer side surface 410 that is at the side opposite to the first inner side surface 41i; and the first outer side surface 410 is covered with the second layer 42.

In the electrostatic chuck 900 as shown in FIG. 3B, for example, a portion of the first outer side surface 410 may be covered with the second layer 42. In the example, the edge region E that includes the edge portion 40e of the ceramic layer 40 includes the first layer 41 and the second layer 42;

and the proportion of the first layer 41 increases toward the first upper surface 41u side. In other words, the second layer 42 covers in a state in which the first outer side surface 41o is slanted inward from the first upper surface 41u to the first lower surface 41b.

In the electrostatic chuck 900 shown in FIGS. 3A and 3B, low particle generation and plasma resistance can be realized with good cooling performance and thermal uniformity.

Here, the edge portion 40e is the portion at which the upper surface and the outer side surface of the ceramic layer 40 contact each other. In the example of FIG. 2, the portion at which the first upper surface 41u and the first outer side surface 41o contact each other is the edge portion 40e. The edge region E refers to a region that includes the edge portion 40e.

Also, the first inner side surface 41i may be covered with the second layer 42. A current path toward the base plate 50 is blocked thereby, the voltage applied to the first layer 41 is stable, and the clamping force is stable.

In FIG. 3B, for example, the edge portion 40e of the first upper surface 41u of the ceramic layer 40 may be beveled (not illustrated). Therefore, the particle generation from the outer circumference edge portion at which the thermal load is large can be effectively suppressed.

Returning now to FIG. 1, the electrostatic chuck 900 will be described in detail.

The ceramic dielectric substrate 30 includes the first major surface 30a and the second major surface 30b. The first major surface 30a is the surface on which the wafer W that is the clamping object is placed. The second major surface 30b is the surface at the side opposite to the first major surface 30a. The wafer W that is the clamping object is, for example, a semiconductor substrate such as a silicon wafer, etc.

The first clamping electrode 10 is located inside the ceramic dielectric substrate 30. The first clamping electrode 10 is located between the first major surface 30a and the second major surface 30b in the Z-axis direction. In other words, the first clamping electrode 10 is inserted into the ceramic dielectric substrate 30. For example, the first clamping electrode 10 may be embedded in the ceramic dielectric substrate 30 by sintering as a continuous body.

The first clamping electrode 10 has a thin-film configuration along the first and second major surfaces 30a and 30b of the ceramic dielectric substrate 30.

Figure 5:
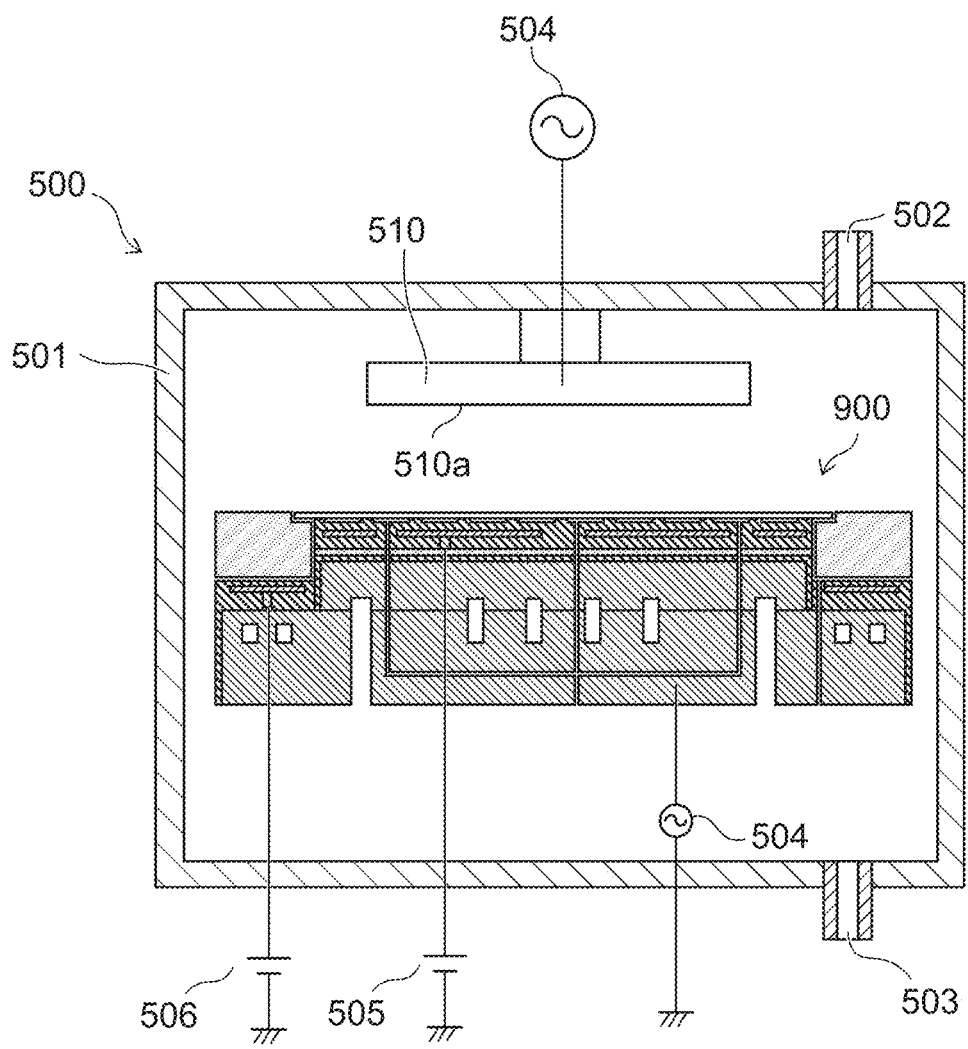
FIG. 5 is a cross-sectional view schematically illustrating a wafer processing apparatus that includes the electrostatic chuck according to the embodiment.

The first clamping electrode 10 is connected with a clamping power supply (a clamping power supply 505 of FIG. 5). In the first electrostatic chuck part 100, a charge is generated at the first major surface 30a side of the first clamping electrode 10 by applying a voltage (a clamping voltage) from the clamping power supply to the first clamping electrode 10; and the wafer W that is the object is clamped by the electrostatic force. The clamping power supply supplies a direct current (DC) current or an alternating current (AC) current to the first clamping electrode 10. The clamping power supply is, for example, a DC power supply. The clamping power supply may be, for example, an AC power supply.

For example, the first clamping electrode 10 is made of metal. The first clamping electrode 10 includes, for example, at least one of Ag, Pd, Pt, Mo, or W. For example, the first clamping electrode 10 may include a metal and a ceramic.

The ceramic layer 40 includes a third major surface 40a and a fourth major surface 40b. The third major surface 40a is a surface at which the focus ring F that is the clamping object is placed. The fourth major surface 40b is the surface at the side opposite to the third major surface 40a. The focus ring F that is the clamping object includes, for example, silicon (silicon) and silicon carbide (SiC). As described above, when the ceramic layer 40 includes the first layer 41 and the second layer 42, the first upper surface 41u forms the third major surface 40a; and the second lower surface 42b forms the fourth major surface 40b.

In the example as shown in FIG. 1, the third major surface 40a is positioned even lower than the second major surface 30b of the ceramic dielectric substrate 30 in the Z-axis direction.

In the example, the second clamping electrode 20 also is provided inside the ceramic layer 40. The second clamping electrode 20 is located between the third major surface 40a and the fourth major surface 40b in the Z-axis direction. In other words, the second clamping electrode 20 is inserted into the ceramic layer 40. For example, the second clamping electrode 20 may be embedded in the ceramic layer 40 by thermal spraying, printing, CVD, PVD, etc.

The second clamping electrode 20 has a thin-film configuration along the third and fourth major surfaces 40a and 40b of the ceramic layer 40.

The second clamping electrode 20 is connected with a clamping power supply (a clamping power supply 506 of FIG. 5). In the second electrostatic chuck part 200, a charge is generated at the third major surface 40a side of the second clamping electrode 20 by applying a voltage (a clamping voltage) from the clamping power supply to the second clamping electrode 20; and the focus ring F that is the object is clamped by the electrostatic force. The clamping power supply supplies a direct current (DC) current or an AC current to the second clamping electrode 20. The clamping power supply is, for example, a DC power supply. The clamping power supply may be, for example, an AC power supply.

The power supply for the first clamping electrode 10 and the power supply for the second clamping electrode 20 may be separate or may be the same power supply.

For example, the second clamping electrode 20 is made of metal. The second clamping electrode 20 includes, for example, at least one of Ag, Pd, Pt, Mo, or W. The second clamping electrode 20 may include, for example, a metal and a ceramic.

When the first clamping electrode 10 includes a metal and a ceramic and the second clamping electrode 20 includes a metal and a ceramic, the proportion of the metal volume to the total of the volume of the metal and the volume of the ceramic included in the first clamping electrode 10 may be equal to or different from the proportion of the metal volume to the total of the volume of the metal and the volume of the ceramic included in the second clamping electrode 20.

A connection part 81 that extends to the second major surface 30b side of the ceramic dielectric substrate 30 is provided at the first clamping electrode 10. The connection part 81 is, for example, a via (solid) or a via hole (hollow) electrically connected with the first clamping electrode 10. The connection part 81 may be a metal terminal connected by an appropriate method such as brazing, etc.

A connection part 82 that extends to the fourth major surface 40b side of the ceramic layer 40 is provided at the second clamping electrode 20. The connection part 82 is, for example, a via (solid) or a via hole (hollow) electrically connected with the second clamping electrode 20. The connection part 82 may be a metal terminal connected by an appropriate method such as brazing, etc. Or, the connection part 82 may be formed by thermal spraying.

The connection part 82 electrically connects the second clamping electrode 20 and the base plate 50; and the clamping power supply (the clamping power supply 506 of FIG. 5) may be connected to the base plate.

For example, a third layer (not illustrated) that contacts the second clamping electrode 20 between the first layer 41 and the second layer 42 of the ceramic layer 40 may be provided; and the third layer and the connection part 82 may contact each other.

The base plate 50 is, for example, a member that supports the ceramic dielectric substrate 30. The ceramic dielectric substrate 30 is fixed on the base plate 50 by a bonding member 60. For example, a silicone adhesive is used as the bonding member 60.

For example, the base plate 50 is divided into an upper part 50a and a lower part 50b; and a communicating path 55 is provided between the upper part 50a and the lower part 50b. One end of the communicating path 55 is connected to an inlet path 56; and the other end of the communicating path 55 is connected to an outlet path 57.

The base plate 50 also performs the role of temperature regulation of the first electrostatic chuck part 100 and the second electrostatic chuck part 200. For example, when cooling the first electrostatic chuck part 100 and the second electrostatic chuck part 200, a cooling medium such as helium gas or the like is caused to inflow through the inlet path 56, pass through the communicating path 55, and outflow from the outlet path 57. Thereby, the heat of the base plate 50 is absorbed by the cooling medium; and the ceramic dielectric substrate 30 and the ceramic layer 40 that are mounted on the base plate 50 can be cooled. On the other hand, when maintaining the temperature of the first electrostatic chuck part 100 and the second electrostatic chuck part 200, it is also possible to supply a heat-retaining medium to the communicating path 55. It is also possible to embed heating elements in the ceramic dielectric substrate 30, the ceramic layer 40, and the base plate 50. The temperatures of the wafer W that is the object clamped by the first electrostatic chuck part 100 and/or the focus ring F that is the object clamped by the second electrostatic chuck part 200 can be regulated by regulating the temperatures of the base plate 50, the ceramic dielectric substrate 30, and the ceramic layer 40.

In the example as described above, the groove 34 is located in the first major surface 30a side of the ceramic dielectric substrate 30. The groove 34 is recessed in the direction (the Z-axis direction) from the first major surface 30a toward the second major surface 30b and continuously extends in the X-Y plane. When the portion where the groove 34 is not provided is taken as the protrusion 33, the wafer W that is the object is placed on the protrusion 33. The first major surface 30a is the surface that contacts the back surface of the wafer W that is the object. In other words, the first major surface 30a is a plane including the upper surface of the protrusion 33. A space is formed between the groove 34 and the back surface of the wafer W that is the object placed on the first electrostatic chuck part 100.

The ceramic dielectric substrate 30 includes the through-hole 35 that is connected with the groove 34. The through-hole 35 is provided from the second major surface 30b to the first major surface 30a. In other words, the through-hole 35 extends in the Z-axis direction from the second major surface 30b to the first major surface 30a and extends through the ceramic dielectric substrate 30.

The temperature of the wafer W that is the object and the particles adhered to the wafer W can be controlled in a favorable state by appropriately selecting the height of the protrusion 33 (the depth of the groove 34), the surface area ratio and shapes of the protrusion 33 and the groove 34, etc.

The gas inlet path 53 is provided in the base plate 50. For example, the gas inlet path 53 extends through the base plate 50. The gas inlet path 53 may not extend through the base plate 50, and may be provided at the ceramic dielectric substrate 30 side by diverging partway through another gas inlet path 53. Also, the gas inlet path 53 may be provided at multiple locations of the base plate 50.

The gas inlet path 53 communicates with the through-hole 35. In other words, the transfer gas (helium (He), etc.) that flows into the gas inlet path 53 flows into the through-hole 35 after passing through the gas inlet path 53.

The transfer gas that flows into the through-hole 35 flows into the space provided between the groove 34 and the wafer W that is the object after passing through the through-hole 35. Thereby, the wafer W can be directly cooled by the transfer gas.

The ceramic layer 40 includes the through-hole 45. The through-hole 45 is provided from the fourth major surface 40b to the third major surface 40a. In other words, the through-hole 45 extends in the Z-axis direction from the fourth major surface 40b to the third major surface 40a and extends through the ceramic layer 40. In the second electrostatic chuck part 200 as well, similarly to the first electrostatic chuck part 100, the gas inlet path 53 communicates with the through-hole 45. In other words, the transfer gas (helium (He), etc.) that flows into the gas inlet path 53 flows into the through-hole 45 after passing through the gas inlet path 53.

The transfer gas that flows into the through-hole 45 directly cools the focus ring F that is the object after passing through the through-hole 45. In the electrostatic chuck 900, for example, the density of the first layer 41 is low when the first layer 41 is formed by thermal spraying; therefore, for example, the transfer gas can be diffused through the first layer 41. Accordingly, the transfer gas can reach the entire first upper surface 41u of the first layer 41; and the focus ring F can be cooled more efficiently.

The thickness of the first clamping electrode 10 is, for example, 1 µm to 100 µm. The thickness of the second clamping electrode 20 is, for example, 1 µm to 100 µm. For example, the thickness of the second clamping electrode 20 may be greater than the thickness of the first clamping electrode 10. For example, the second clamping electrode 20 also may be used as a high frequency electrode (a RF electrode) for plasma generation.

Here, the thicknesses of the first clamping electrode 10 and/or the second clamping electrode 20 refer to the lengths in the Z-axis direction of the first clamping electrode 10 and/or the second clamping electrode 20.

A method for making the second electrostatic chuck part 200 will now be described.

For example, the second layer 42 is formed by thermal spraying on the second part 52 of the base plate 50. The second layer 42 is, for example, an $Al_2O_3$ layer. The thickness of the second layer 42 is, for example, 50µm to 5000 µm. Then, for example, the second clamping electrode 20 is formed by thermal spraying. Then, for example, the first layer 41 is formed by thermal spraying. The first layer 41 is, for example, an $Al_2O_3$—$TiO_2$ layer. The added amount of $TiO_2$ is, for example, 1 wt % to 15 wt %. The thickness of the first layer 41 is, for example, 50 to 500 µm.

After forming the second electrostatic chuck part 200, the first electrostatic chuck part 100 may be provided on the first part 51 of the base plate 50 via the bonding member 60.

For example, the first clamping electrode 10 is formed by screen printing, paste coating (spin coating, a coater, inkjet, a dispenser, etc.), vapor deposition, etc. For example, the first clamping electrode 10 can be formed by separately performing multiple stacking of the layers in a state in which the first major surface 30a is down.

FIG. 5 is a cross-sectional view schematically illustrating a wafer processing apparatus that includes the electrostatic chuck 900 according to the embodiment.

As illustrated in FIG. 5, the wafer processing apparatus 500 includes a processing container 501, a high frequency power supply 504, the clamping power supply 505, an upper electrode 510, and the electrostatic chuck 900. The upper electrode 510 and a processing gas inlet 502 for introducing a processing gas to the interior are provided in the ceiling of the processing container 501. An exhaust port 503 for evacuating the interior is provided in the bottom plate of the processing container 501. The first electrostatic chuck part 100 is disposed under the upper electrode 510 inside the processing container 501. In the first electrostatic chuck part 100, the first clamping electrode 10 is connected with the clamping power supply 505. In the second electrostatic chuck part 200, the second clamping electrode 20 is connected with the clamping power supply 506.

When a voltage (a high frequency voltage) is applied from the high frequency power supply 504 to the base plate 50 and the upper electrode 510; a high frequency electric discharge is generated and the processing gas that is introduced to the processing container 501 is excited and activated by plasma; and the wafer W that is the object is processed.

When a voltage (a clamping voltage) is applied from the clamping power supply 505 to the first clamping electrode 10, a charge is generated at the first major surface 30a side of the first clamping electrode 10; and the wafer W that is the object is clamped to the first electrostatic chuck part 100 by the electrostatic force. When a voltage (a clamping voltage) is applied from the clamping power supply 506 to the second clamping electrode 20, a charge is generated at the third major surface 40a side of the second clamping electrode 20; and the focus ring F that is the object is clamped to the second electrostatic chuck part 200 by the electrostatic force.

Figure 6:
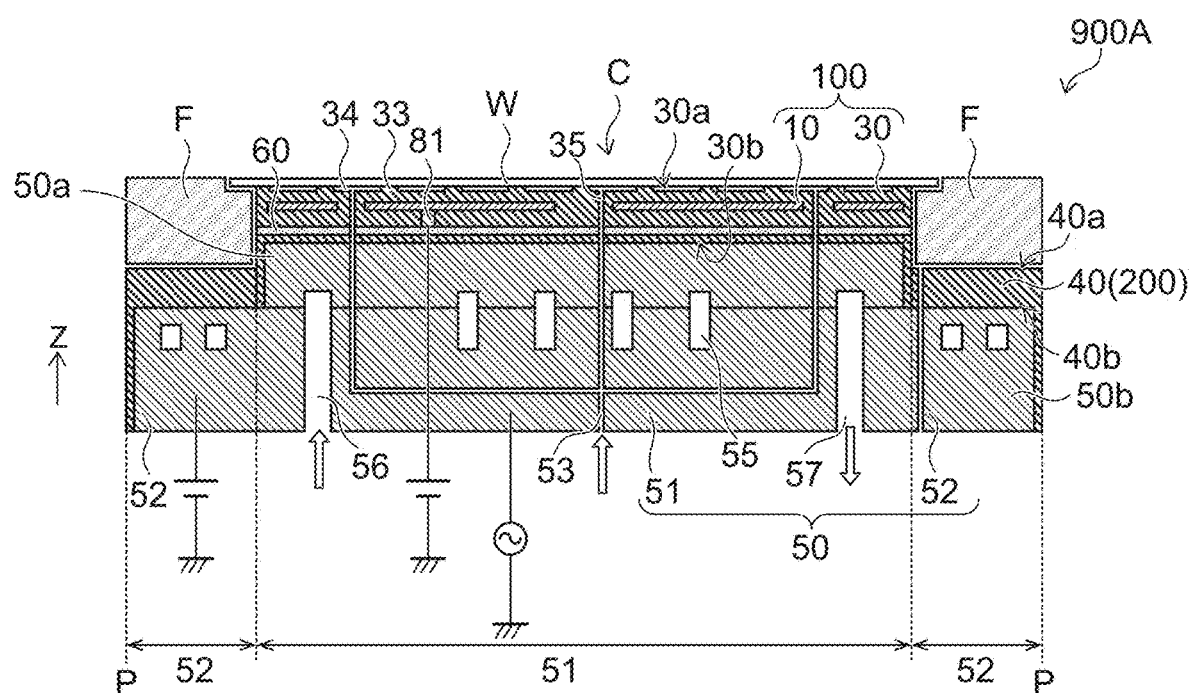
FIG. 6 is a cross-sectional view schematically illustrating an electrostatic chuck according to a modification of the embodiment.

FIG. 6 is a cross-sectional view schematically illustrating an electrostatic chuck according to a modification of the embodiment.

Figure 7:
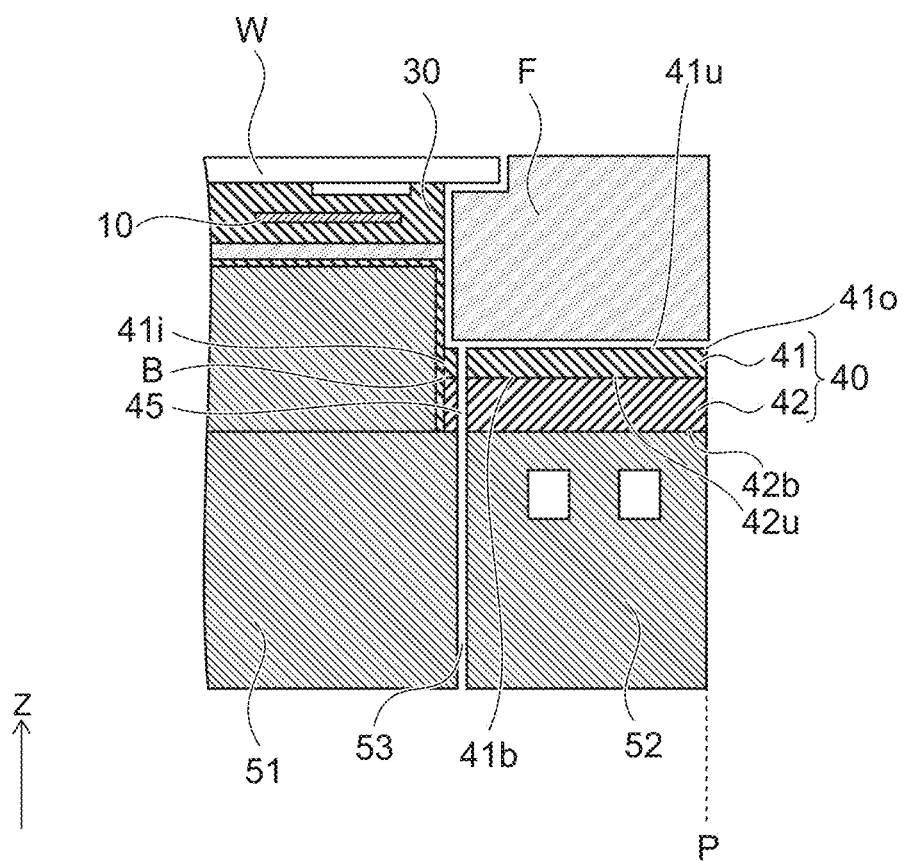
FIG. 7 is an enlarged cross-sectional view schematically illustrating a portion of the electrostatic chuck according to the modification of the embodiment.

FIG. 7 is an enlarged cross-sectional view schematically illustrating a portion of the electrostatic chuck according to the modification of the embodiment.

Figure 8A:
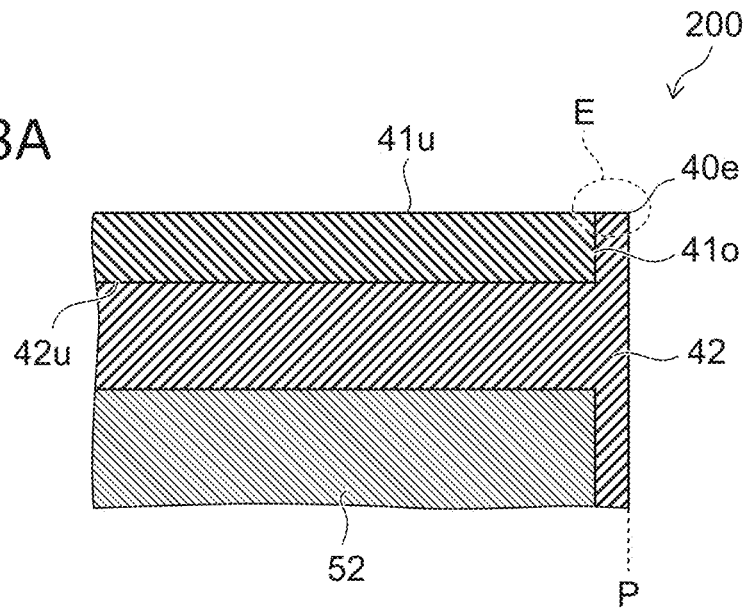
FIGS. 8A and 8B are enlarged cross-sectional views schematically illustrating portions of the electrostatic chuck according to the modification of the embodiment.
Figure 8B:
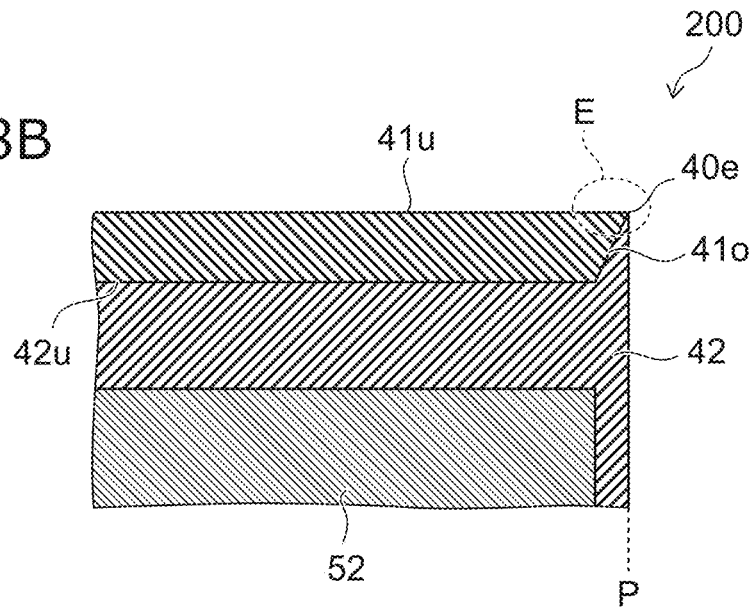

FIGS. 8A and 8B are enlarged cross-sectional views schematically illustrating portions of the electrostatic chuck according to the modification of the embodiment.

Figure 9:
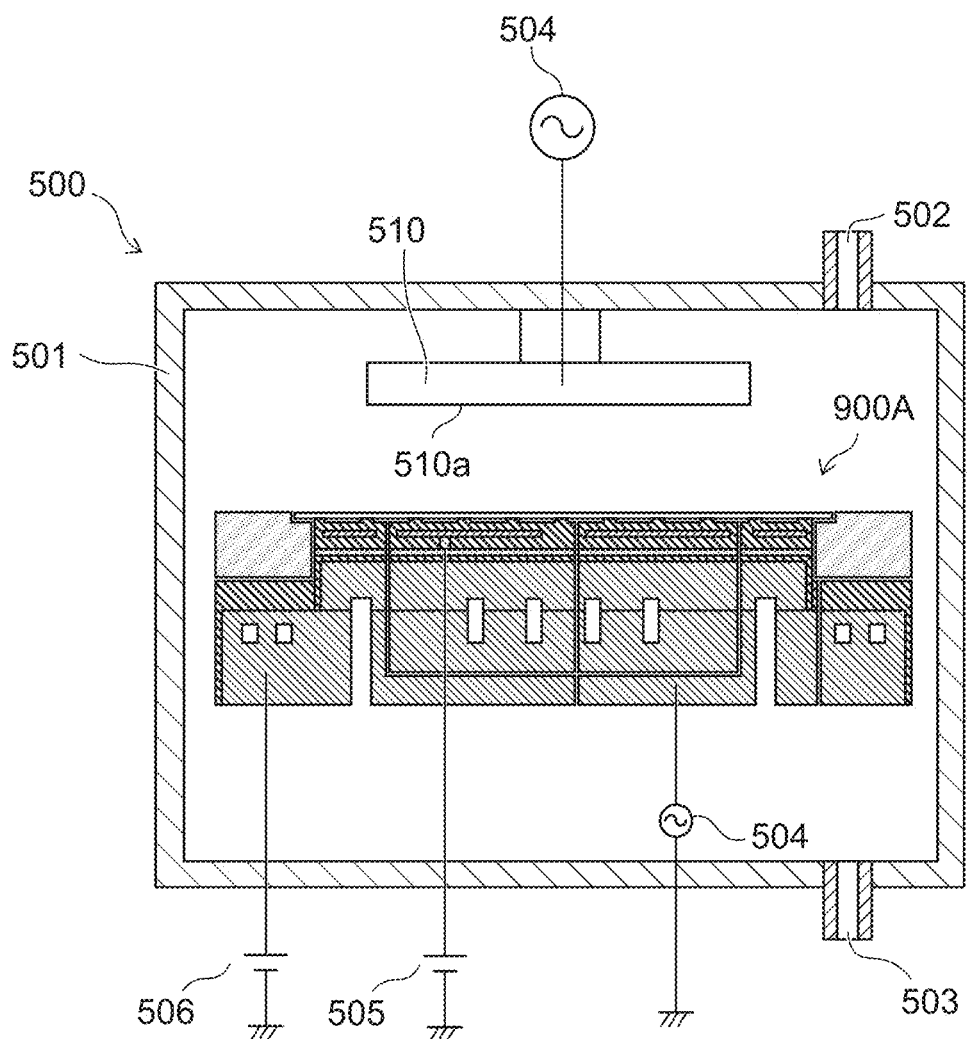
FIG. 9 is a cross-sectional view schematically illustrating a wafer processing apparatus that includes the electrostatic chuck according to the modification of the embodiment.

FIG. 9 is a cross-sectional view schematically illustrating a wafer processing apparatus that includes the electrostatic chuck according to the modification of the embodiment.

In the electrostatic chuck 900A according to the modification of the embodiment as illustrated in FIGS. 6 to 9, the second clamping electrode 20 is omitted from the ceramic layer 40. The ceramic layer 40 includes the first layer 41 and the second layer 42; and the first layer 41 and the second layer 42 are provided to directly contact each other via the boundary B.

In the example, the base plate 50 is used as the clamping electrode for the focus ring F. More specifically, the base plate 50 is connected with a clamping power supply (the clamping power supply 506 of FIG. 9). In the second electrostatic chuck part 200, by applying a voltage (a clamping voltage) from the clamping power supply to the base plate 50, a charge is generated at the surface of the base plate 50 at the fourth major surface 40b side; and the focus ring F that is the object is clamped by the electrostatic force.

The power supply for the first clamping electrode 10 and the power supply for the base plate 50 may be separate or may be the same power supply.

Other than the second clamping electrode 20 being omitted and the base plate 50 being used as the clamping electrode for the focus ring F, the electrostatic chuck 900A according to the modification of the embodiment is substantially the same as the electrostatic chuck 900 according to the embodiment described above; therefore, a description of the other portions is omitted.

In the electrostatic chuck 900A according to the modification of the embodiment as well, the second layer 42 is located between the electrically-conductive base plate 50 and the first layer 41; therefore, for example, the first layer 41 of the ceramic layer 40 is independent of the base plate 50 to which the high frequency (RF) for plasma generation is applied, effects on the ceramic layer 40 of the temperature change of the base plate 50 are relaxed, and a stable clamping force of the second electrostatic chuck part 200 is possible. For example, the dielectric breakdown of the ceramic layer 40 when high frequency power is applied by using the base plate 50 as a lower electrode also can be suppressed.

According to embodiments as described above, an electrostatic chuck can be provided in which the yield of the device can be increased.

Hereinabove, exemplary embodiments of the invention are described. However, the invention is not limited to these specific examples. For example, various modifications made by one skilled in the art in regard to embodiments described above are within the scope of the invention to the extent that the purport of the invention is included. For example, the shapes, the dimensions, the materials, the dispositions, the mounting forms, etc., of the components included in the electrostatic chuck are not limited to those illustrated and can be modified as appropriate. Any two or more components of the specific examples may be combined within the extent of technical feasibility, and are within the scope of the invention to the extent that the purport of the invention is included.

What is claimed is:

1. An electrostatic chuck, comprising:
a base plate including a first part and a second part, the second part being located at an outer circumference of the first part, the base plate being electrically-conductive, the base plate including a gas inlet path to which a cooling gas is introduced;
a first electrostatic chuck part provided on the first part, the first electrostatic chuck part being configured to clamp a wafer, the first electrostatic chuck part including
a ceramic dielectric substrate including at least one through-hole communicating with the gas inlet path, and
a first clamping electrode embedded in the ceramic dielectric substrate; and
a second electrostatic chuck part provided on the second part, the second electrostatic chuck part being configured to clamp a focus ring, the second electrostatic chuck part including a ceramic layer including at least one through-hole to which a cooling gas can be introduced,
the ceramic layer including at least a first layer contacting the focus ring when the second electrostatic chuck part clamps the focus ring,
a density of the first layer is less than a density of the ceramic dielectric substrate.

2. The chuck according to claim 1, wherein
the ceramic layer further includes a second layer provided between the second part and the first layer.

3. The chuck according to claim 2, wherein
a density of the second layer is greater than the density of the first layer.

4. The chuck according to claim 2, wherein
the density of the first layer is greater than a density of the second layer.

5. The chuck according to claim 2, wherein
the first layer includes:
　a first upper surface at the focus ring side; and
　a first lower surface at a side opposite to the first upper surface,
the second layer includes:
　a second upper surface at the first layer side; and
　a second lower surface at a side opposite to the second upper surface, and
a surface roughness of the first upper surface is less than a surface roughness of the second lower surface.

6. The chuck according to claim 2, wherein
the first layer includes:
　a first upper surface at the focus ring side; and
　a first lower surface at a side opposite to the first upper surface,
the first layer and the second layer are provided in contact,
a boundary is located between the first layer and the second layer, and
a surface roughness of the first upper surface is less than a surface roughness of the boundary.

7. The chuck according to claim 2, wherein
the second electrostatic chuck part further includes a second clamping electrode embedded in the ceramic layer,
the first layer includes:
　a first upper surface at the focus ring side; and
　a first lower surface at a side opposite to the first upper surface,
the second layer includes:
　a second upper surface at the first layer side; and
　a second lower surface at a side opposite to the second upper surface,
the second clamping electrode is located between the first lower surface and the second upper surface,
the second clamping electrode includes:
　a second electrode upper surface at the first upper surface side; and
　a second electrode lower surface at a side opposite to the second electrode upper surface, and
a surface roughness of the second electrode upper surface is less than a surface roughness of the second electrode lower surface.

8. The chuck according to claim 1, wherein
the first layer includes:
　a first upper surface at the focus ring side;
　a first lower surface at a side opposite to the first upper surface;
　a first inner side surface at the first electrostatic chuck part side, the first inner side surface being perpendicular to the first upper surface and the first lower surface; and
　a first outer side surface at a side opposite to the first inner side surface, and
the first outer side surface is covered with the second layer.

9. The chuck according to claim 8, wherein
an edge region includes an edge portion of the ceramic layer and includes the first and second layers, and
a proportion of the first layer in the edge region increases toward the first upper surface side.

10. The chuck according to claim 1, wherein
the first layer includes:
　a first upper surface at the focus ring side; and
　a first lower surface at a side opposite to the first upper surface, and
an edge portion of the first upper surface is beveled.

* * * * *